(12) United States Patent
Salama et al.

(10) Patent No.: US 7,738,257 B2
(45) Date of Patent: Jun. 15, 2010

(54) MICROELECTRONIC DEVICE INCLUDING BRIDGING INTERCONNECT TO TOP CONDUCTIVE LAYER OF PASSIVE EMBEDDED STRUCTURE AND METHOD OF MAKING SAME

(75) Inventors: Islam Salama, Chandler, AZ (US); Yongki Min, Phoenix, AZ (US); Huankiat Seh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 289 days.

(21) Appl. No.: 11/610,385

(22) Filed: Dec. 13, 2006

(65) Prior Publication Data

US 2008/0142253 A1    Jun. 19, 2008

(51) Int. Cl.
*H05K 1/18* (2006.01)
(52) U.S. Cl. .............................. 361/763; 257/E27.113; 29/846
(58) Field of Classification Search ................. 361/811, 361/763, 751, 766, 767, 768, 778, 780, 793, 361/794; 257/E27.113, E27.116, 532; 29/832, 29/846
See application file for complete search history.

(56) References Cited

U.S. PATENT DOCUMENTS 6,224,965 B1 * 5/2001 Haas et al. ................... 428/209
7,480,150 B2 * 1/2009 Kariya et al. ................. 361/763
2003/0136997 A1 * 7/2003 Shioga et al. ................ 257/306

FOREIGN PATENT DOCUMENTS

KR    1020030040083 A    5/2003
KR    1020060112906 A    11/2006

OTHER PUBLICATIONS

PCT/US2007/086665, Dec. 5, 2007, International Search Report.

* cited by examiner

*Primary Examiner*—Matthew C Landau
*Assistant Examiner*—Daren Wolverton
(74) *Attorney, Agent, or Firm*—Blakely, Sokoloff, Taylor & Zafman LLP (57) ABSTRACT

A microelectronic device, a method of fabricating the device, and a system including the device. The device includes: a substrate including a polymer build-up layer, and a passive structure embedded in the substrate. The passive structure includes a top conductive layer overlying the polymer build-up layer, a dielectric layer overlying the top conductive layer, and a bottom conductive layer overlying the dielectric layer. The device further includes a conductive via extending through the polymer build-up layer and electrically insulated from the bottom conductive layer, an insulation material insulating the conductive via from the bottom conductive layer, and a bridging interconnect disposed at a side of the top conductive layer facing away from the dielectric layer, the bridging interconnect electrically connecting the conductive via to the top conductive layer.

12 Claims, 8 Drawing Sheets

MICROELECTRONIC DEVICE INCLUDING BRIDGING INTERCONNECT TO TOP CONDUCTIVE LAYER OF PASSIVE EMBEDDED STRUCTURE AND METHOD OF MAKING SAME

FIELD

Embodiments of the present invention relate generally to the field of microelectronic fabrication. More specifically, embodiments of the present invention relate to microelectronic substrates including active or passive components embedded therein.

BACKGROUND

The demand for increased mobility in consumer electronics is pressuring manufacturers to scale electronic technologies (e.g., semiconductor devices) to ever smaller dimensions. At the same time, the demand for increased functionality, speed, noise elimination, etc., is forcing manufactures to increase the number of passive components (e.g., capacitors and resistors) used by consumer electronic devices. Passive component integration has traditionally been accomplished by mounting them onto package and/or printed circuit board (PCB) substrate surfaces. Restricting the location of the passive components to the substrate's surface however can limit the passive components' operational capabilities (due to their inherent distance from the semiconductor device) and the substrate's scalability.

One way manufacturers are attempting to address this is by embedding the passive components in the substrate, a technique referred to as embedded passive technology. This frees up surface real estate and facilitates substrate miniaturization. Speed and signal integrity also improves because embedded components provide a more direct path through which the IC signals propagate.

One particular area of interest with respect to embedded passive technology has been the incorporation of thin film capacitors (TFCs) into organic packaging (e.g., bismaleimide triazine resin, etc.) substrates. Among the various materials being considered for use as capacitor dielectrics are high-k ceramic materials. However, high-k ceramic materials can require processing at high temperatures (e.g., furnace annealing at 600-800 degrees Celsius) in order to achieve their high dielectric constant properties. At these temperatures, organic packaging substrates can melt.

Figure 1:
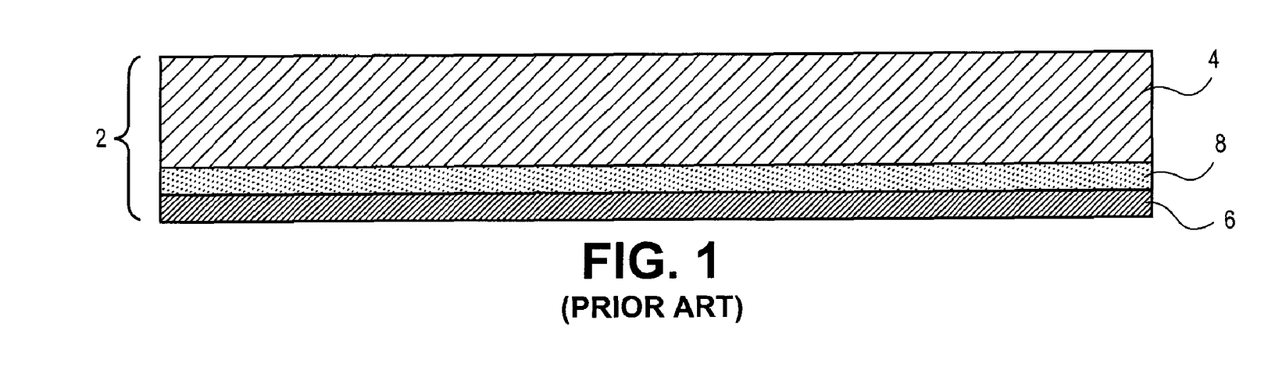
FIGS. 1-5 illustrate cross-sectional views showing formation of an embedded passive component in an organic substrate using conventional methods.
Figure 2:
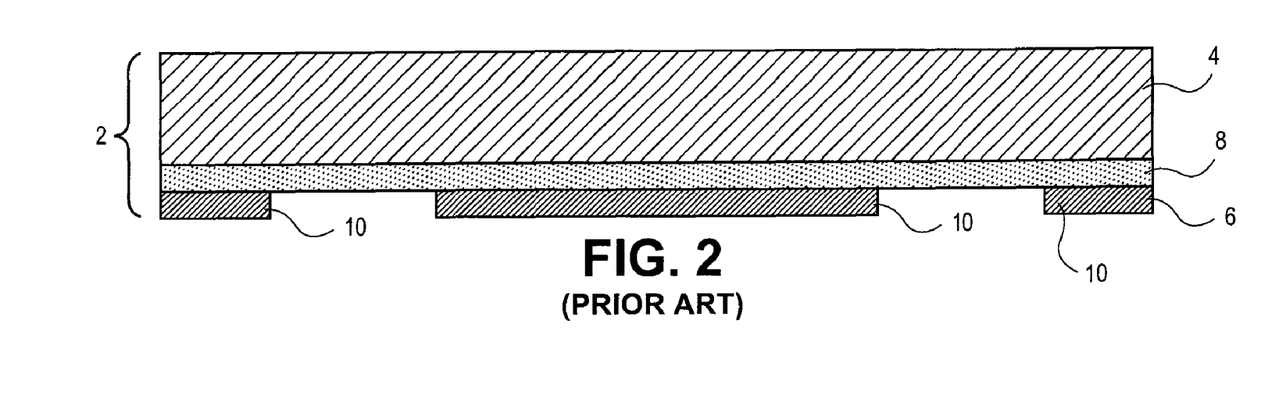
Figure 3:
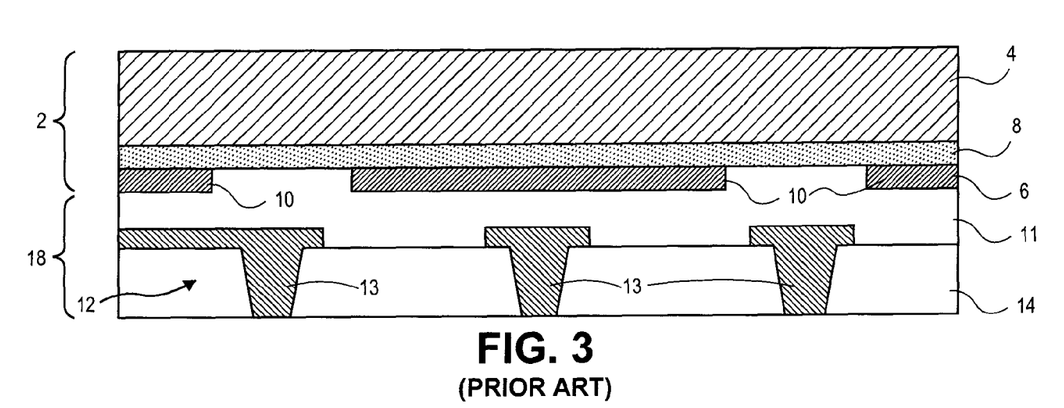
Figure 4:
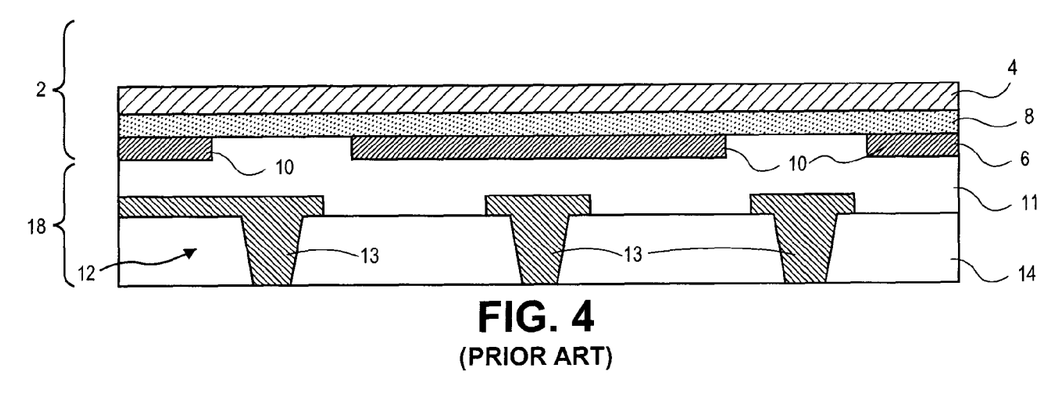
Figure 5:
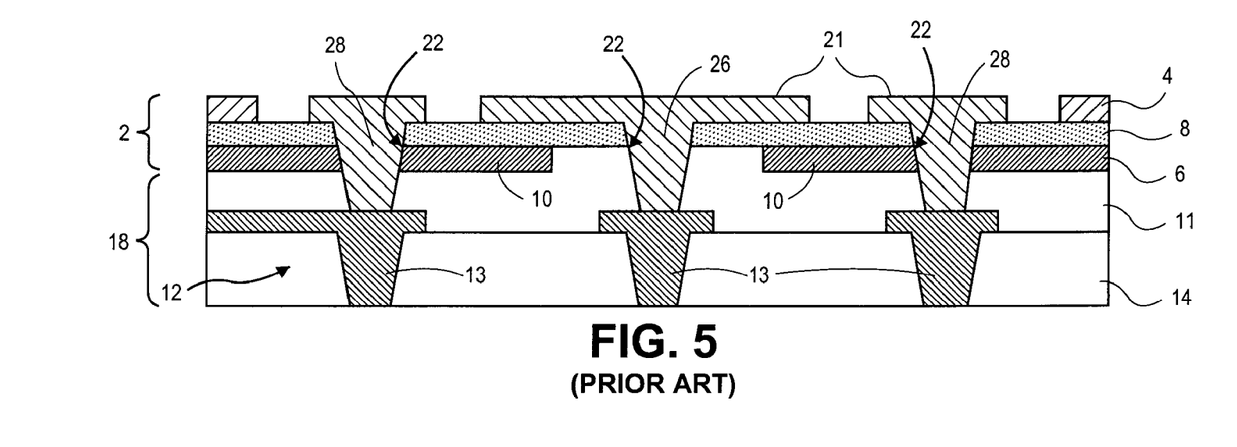

One technique for addressing this involves mounting a pre-fabricated TFC laminate that has already been annealed onto the organic substrate. Shown in FIG. 1 is an example illustration of such a TFC laminate 2, which includes a high-k ceramic material 8, superimposed between conductive films 6 and 4. In FIG. 2, the conductive film 6 portion of the TFC laminate 2 has been patterned to define lower electrode structures 10. In FIG. 3 the partially patterned TFC 2 is then mounted to a substrate 18 that includes polymer build-up layers 11, 14 and copper build-up layer 12. The copper build-up layer 12 connects with underlying conductive structures (not shown) by way of via portions 13. Next, as shown in FIG. 4, the conductive film 4 is thinned and patterned to form upper electrode portions 21 (as shown in FIG. 5). Then, as shown in FIG. 5, via openings 22 are formed thru the high-k ceramic material, the polymer build-up layer 11, and in some cases, portions of the lower electrode structures 10, to expose underlying portions of copper build-up layer 12. As further seen in FIG. 5, a conductive material is deposited in the via openings and over the surface of the TFC where it is then thinned and patterned to form upper electrodes 26, biasing interconnects 28 for the lower electrodes, I/O interconnects, build-up interconnect structures, and/or the like.

The use of this integration scheme however is not without its problems. More specifically, any one of the processes used to pattern the lower electrodes 10, the upper electrode portions 21, and/or the via openings 22 can damage the hi-k ceramic dielectric 8 and thereby impact the functionality of the TFC.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a microelectronic device, a method of fabricating the device, and a system incorporating the device are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, onto, above, below, and adjacent as used herein refer to the position of one element relative to other elements. As such, a first element disposed on, onto, above, or below a second element may be directly in contact with the second element or it may include one or more intervening elements. In addition, a first element disposed next to or adjacent a second element may be directly in contact with the second element or it may include one or more intervening elements. In addition, in the instant description and/or figures, figures and/or elements may be referred to in the alternative. In such a case, for example where the description refers to Figs. X/Y showing an element A/B, what is meant is that Fig. X shows element A and Fig. Y shows element B. In addition, where Fig. X shows a reference numeral A/B and the description refers to element AB in Fig. X, what is meant is that the element labeled in Fig. X with reference numeral A/B corresponds to either an element labeled in another figure with reference numeral A or to an element labeled in yet another figure with reference numeral B.

Aspects of this and other embodiments will be discussed herein with respect to FIGS. 1-16, below. The figures, however, should not be taken to be limiting, as they are intended for the purpose of explanation and understanding.

Figure 11:
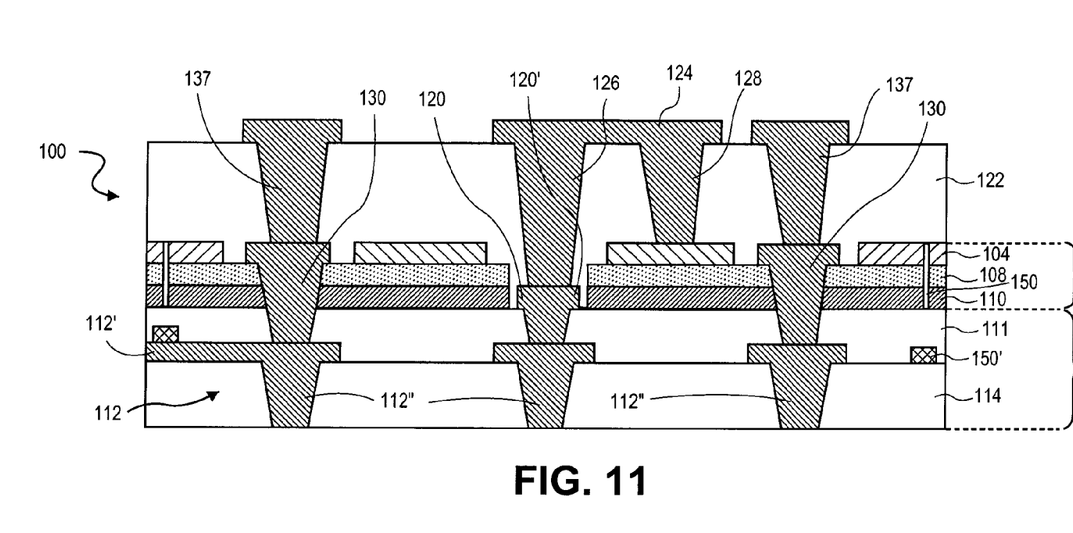
FIG. 11 illustrates a package including a TFC embedded in a substrate according to the first embodiment.

Reference is first made to FIG. 11, where a microelectronic device 100 is shown according to a first embodiment. As seen in FIG. 11, the device includes a passive structure, such as, for example, a TFC 102, embedded in a substrate 118. The passive structure may include a dielectric layer such as, for example, a capacitor dielectric layer 108 of TFC 102. Any number of materials can be used to form the dielectric layer. For example, where the dielectric layer is the capacitor dielectric layer 108, it can include high dielectric constant (high-k) materials such as barium titinate ($BaTiO_3$), strontium titinate ($SrTiO_3$), barium strontium titinate ($BaSrTiO_3$), or the like. For the purposes of this specification and as used by one of ordinary skill, barium titinate and barium strontium titinate are commonly also referred to as BT and BST, respectively. The dielectric layer overlies a bottom conductive layer, which, in the shown embodiment, is in the form of a bottom electrode layer 110 of TFC 102. Bottom electrode layer 110 may include materials such as copper, nickel, platinum and the like. In one embodiment, the bottom electrode layer 110 has a thickness between about 5 to about 40 microns. In one embodiment, the bottom electrode layer 110 is made of copper, and has a thickness between about 10 to about 20 microns. As seen in FIG. 11, a top conductive layer in the form of a top electrode layer 104 overlies the capacitor dielectric layer 108. The top electrode layer 104 may include metal materials, such copper, nickel or the like. The top electrode layer 104 may include a metal foil layer having a thickness between about 20 to 100 μm. In one embodiment, the top electrode layer 104 includes a nickel foil having a thickness of about 30 μm microns. TFC 102 is shown in FIG. 11 as having been embedded in substrate 118. In one embodiment, as shown for example in FIG. 11, the substrate 118 may include a packaging substrate having polymer build-up layers 111, 114 and an underlying conductive build-up layer 112. In such as case, substrate 118 may further include underlying layers including a core and additional polymer and conductive build-up layers, as would be recognized by one skilled in the art. The underlying conductive build-up layer 112 includes interconnect layer 112' and vias 112". The polymer build-up layers 111 and 114 can be formed, for example, using a dielectric material such as Ajinomoto Build-Up Film (ABF). The underlying conductive build-up layer 112 can be formed, for example, using copper. The use and formation of the build-up layers of a package substrate, such as substrate 118, is known to one of ordinary skill. Substrate 118 may, for example, include an organic substrate having a core comprising bismaleimide triazine resin. A substrate according to embodiments is not necessarily limited to a packaging substrate, however, and includes any other type of substrate, such as, for example, a PCB substrate, that could equally serve to embed a passive structure.

Referring still to FIG. 11, the device 100 further includes a conductive via 120 that extends through build-up layer 111, and that is electrically insulated from the bottom electrode layer 110. Device 100 further includes a polymer build-up layer 111 overlying the top electrode layer 104. An electrical insulation of the conductive via 120 in the shown embodiment is brought about by the existence of portions of polymer build-up layer 111 between an interconnect 120' overlying via 120 and adjacent portions of the bottom electrode layer 110. Device 100 further includes a bridging interconnect 124 that electrically couples or connects the conductive via 120 to top electrode 104. A connection of conductive via 120 to top electrode 104 is brought about by the existence of a conductive via 126 extending through the polymer build-up layer 111 and connecting the conductive via 120 to the bridging interconnect, and by the existence of a conductive via 128 extending through the polymer build-up layer 111 from the bridging interconnect 124 to the top electrode layer 104. It is possible to see from the exemplary device of FIG. 11 that the device structure allows electrical connection through a substrate to a top conductive layer of an embedded passive structure without the need to pre-pattern the bottom conductive layer of the passive structure prior to embedding. Such electrical connection is brought about in the shown embodiment by the existence of a bridging interconnect and additional vias, such as bridging interconnect 124, and vias 126 and 128, the bridging interconnect being disposed at a side of the top electrode (and not necessarily adjacent thereto) which faces away from the dielectric layer of the passive structure. An insulation of such electrical connection with respect to the bottom conductive layer is brought about in the shown embodiment of FIG. 11 by virtue of an additional polymer build-up layer overlying the top conductive layer. The device 100 may further include biasing conductive vias 130 which are coupled to the bottom electrode layer 110, but insulated from the top electrode layer 104 in a well known manner. Device 100 may further include I/O interconnects (not shown), which provide an electrical connection through a TFC without coupling to either of the top or bottom electrode layers. Provision of biasing conductive vias and of I/O interconnects for embedded passive structures is well known in the art.

Figure 15:
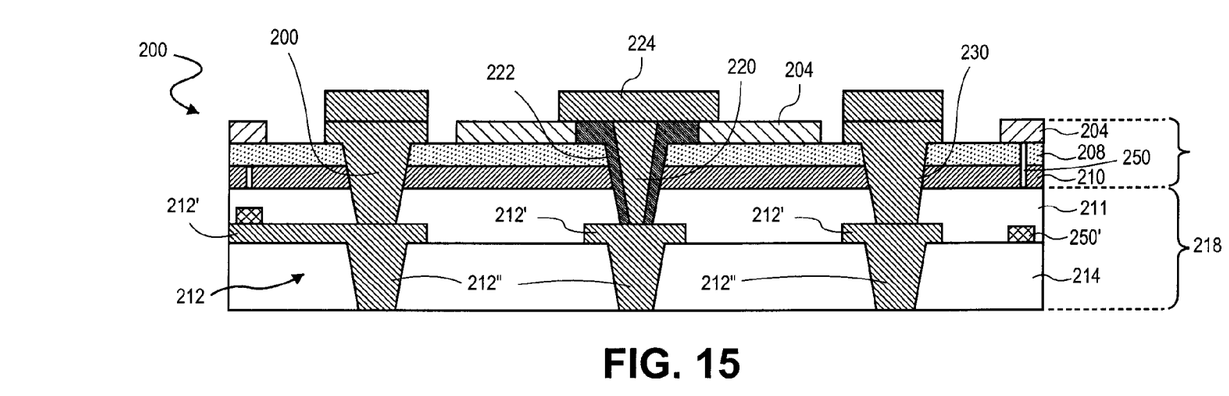
FIG. 15 illustrates a package including a TFC embedded in a substrate according to the second embodiment.

Referring now to FIG. 15, a microelectronic device 200 is shown according to a second embodiment. Similar to FIG. 11 described above, the device includes a passive structure, such as, for example, a TFC 202, embedded in a substrate 218. The passive structure may include a dielectric layer such as, for example, a capacitor dielectric layer 208 of TFC 202. The dielectric layer overlies a bottom conductive layer, which, in the shown embodiment, is in the form of a bottom electrode layer 210 of TFC 202. As seen in FIG. 15, a top conductive layer in the form of a top electrode layer 204 overlies the capacitor dielectric layer 208. TFC 202 is shown as having been embedded in substrate 218. In one embodiment, as shown for example in FIG. 15, the substrate 218 may include a packaging substrate having polymer build-up layers 211, 214 and an underlying conductive build-up layer 212. In such as case, substrate 218 may further include underlying layers including a core and additional polymer and conductive build-up layers, as would be recognized by one skilled in the art. The underlying conductive build-up layer 212 includes interconnect layer 212' and vias 212". It is noted that the materials and specifications for the TFC 202 and substrate 218 may correspond to those materials and specifications already listed above with respect to TFC 102 and substrate 118 of the embodiment of FIG. 11. Similar to device 100 of FIG. 11, device 200 may further include biasing conductive vias 230 which are coupled to the bottom electrode layer 210, but insulated from the top electrode layer 204 in a well known manner. Device 200 may further include I/O interconnects (not shown), which provide an electrical connection through a TFC without coupling to either of the top or bottom electrode layers. As noted above, provision of biasing conductive vias and of I/O interconnects for embedded passive structures is well known in the art.

Referring still to FIG. 15, the device 200 further includes a conductive via 220 that extends through build-up layer 211, and that is electrically insulated from the bottom electrode layer 210. Device 200 further includes an insulation material in the form of an insulation sleeve 222 that surrounds the side walls of conductive via 220. An electrical insulation of the conductive via 220 in the shown embodiment is thus brought about by the existence of portions of insulation sleeve 222 between via 220 and adjacent portions of the bottom electrode layer 210. Device 200 further includes a bridging interconnect 224 that electrically couples or connects the conductive via 220 to top electrode 204. A connection of conductive via 220 to top electrode 204 is brought about by the existence of bridging interconnect 224 connected to the conductive via 220, extending across an overlying insulating ring portion 226 of the sleeve 222, and overlying the top electrode layer 204. Similar to the embodiment of FIG. 11, it is possible to see from the exemplary device of FIG. 15 that the device structure allows electrical connection through a substrate to a top conductive layer of an embedded passive structure without the need to pre-pattern the bottom conductive layer of the passive structure prior to embedding. Such electrical connection is brought about in the shown embodiment by the existence of a bridging interconnect overlying the top electrode layer and connected to a conductive via of the substrate, the bridging interconnect being disposed at a side of the top electrode which faces away from the dielectric layer of the passive structure. An insulation of such electrical connection with respect to the bottom conductive layer is brought about in the shown embodiment of FIG. 15 by virtue of an insulation sleeve surrounding side walls of the conductive via.

Figure 6:
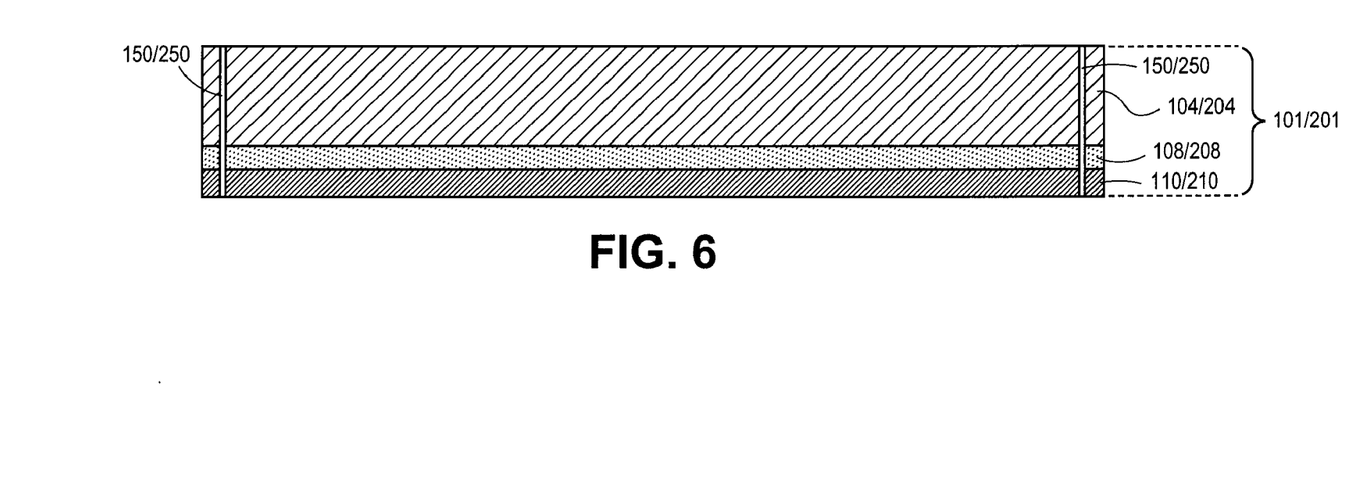
FIGS. 6-8 illustrate various stages for embedding a non-patterned TFC in a substrate according to a first embodiment.
Figure 7:
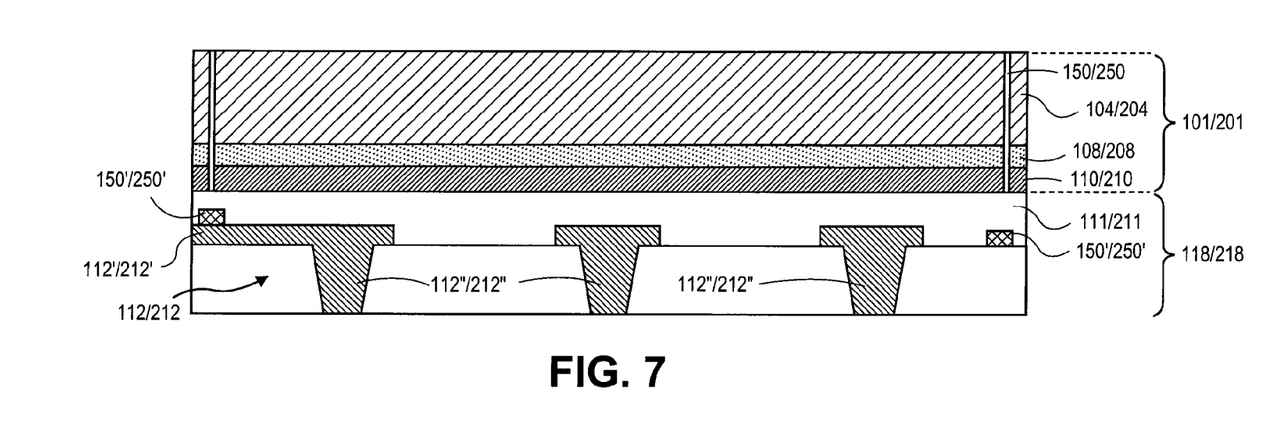
Figure 8:
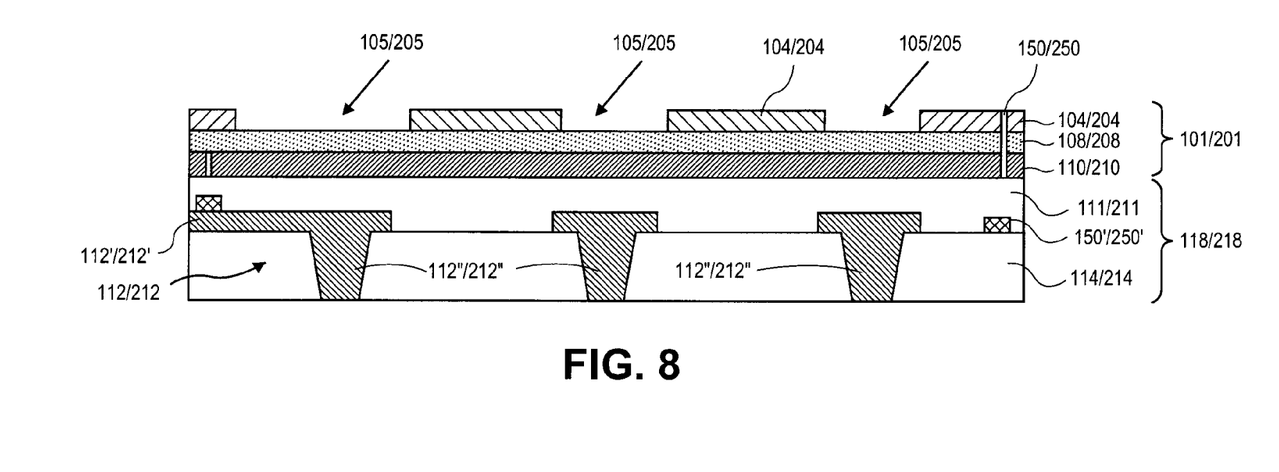

Reference will now be made to FIGS. 6-15, which show stages in practicing a method to fabricate a device such as device 100 of FIG. 11, or such as device 200 of FIG. 15. In particular, while the stages depicted in FIGS. 6-8 are applicable to the fabrication of either of the embodiments of FIG. 11 or 15, the stages depicted in FIGS. 9-10 pertain to the fabrication of the embodiment of FIG. 11, while the stages depicted in FIGS. 12-14 pertain to the fabrication of the embodiment of FIG. 15.

Referring first to FIGS. 6-8, a method of fabricating a microelectronic device according to embodiments includes providing a passive microelectronic structure that is unpatterned, as shown in FIG. 6, embedding the passive structure in a substrate, as shown in FIG. 7, and patterning the passive structure, as shown in part in FIG. 8. It is noted that, in FIGS. 6-8, elements corresponding to similar elements in either of FIG. 11 or 15 described above are labeled with reference numerals corresponding to their counterparts in FIG. 11 or 15. Thus, in the description of FIGS. 6-8, reference to the various components will be made in the alternative to suggest that those components may equally be used to form the device 100 of FIG. 11 or the device 200 of FIG. 15 as described above. It is also noted that elements in either of FIGS. 6-10 or 12-14 corresponding to existing elements in either of FIG. 11 or 15 may be made of the same materials and to the same specifications as described above in relation to FIG. 11 or 15.

Referring first to FIG. 6, a method embodiment includes providing a passive microelectronic structure 101/201 which includes an unpatterned bottom electrode layer 110/210, an unpatterned capacitor dielectric layer 108/208 overlying the bottom electrode layer 110/210, and an unpatterned top electrode layer 104/204 overlying the capacitor dielectric layer 108/208. Structure 101/201 is shown as having been provided with fiducials, such as, for example, drilled fiducials 150/250 as would be well known in the art.

Referring next to FIG. 7, a method embodiment includes embedding the passive structure 101/201 in a substrate 118/218. For example, embedding may include aligning the fiducials 150/250 on the passive structure 101/201 to substrate level fiducials 150'/250'. The substrate level fiducials 150'/250' may be patterned at the layer below the passive structure 101/201, that is, at the conductive layer 112/212, not only at a panel-level, but also at a unit-level relative to the panel-level. By allowing alignment at unit level, the alignment accuracy may be improved. It is noted however that the use of fiducials is merely an option according to embodiments. Embedding may further include mounting the unpatterned passive structure 101/201 onto a polymer build-up layer 111/211 of a substrate 118/218. The polymer build-up layer 111/211 as shown in FIG. 7 may for example be a B-stage, uncured, dielectric layer, as would be well known by one skilled in the art. Embedding as shown in FIG. 7 may include curing the polymer build-up layer 111/211 in a well known manner.

Referring to FIG. 8, a method embodiment may include patterning the passive structure 101/201 after embedding. In the shown embodiment, patterning includes first thinning the top electrode layer 104/204, and then patterning the same to form openings 105/205 therein that expose portions of the capacitor dielectric layer 108/208. Thinning may involve, according to one embodiment, using, for instance, a wet etch process, a dry etch process, a polishing process, combinations thereof or the like. To the extent that the top electrode layer may include nickel, thinning can be accomplished by etching it with a wet etchant, such as ferric chloride ($FeCl_3$). In one embodiment, the top electrode layer 104/204 may be thinned to between approximately 10-20 microns. Thinning facilitates patterning of the top electrode layer structures by reducing the amount of conductive material that must be removed. After thinning, the top electrode layer 104/204 may be patterned with resist and then etched to define the openings 105/205 as shown. Etching can be accomplished using wet or dry etch processes. In one embodiment, the top electrode layer 104/204 may be etched using a ferric chloride solution.

After formation of the structure of FIG. 8, a method embodiment includes providing a conductive via 120/220 (see FIGS. 11 and 15) extending through the polymer build up layer 111/211 and electrically insulated from the bottom electrode layer 110/210, providing an insulation material 122/222 insulating the conductive via 120/220 from the bottom electrode layer 110/210, and providing a bridging interconnect 124/224 electrically connecting the conductive via 120/220 to the top electrode layer 104/204.

Figure 9:
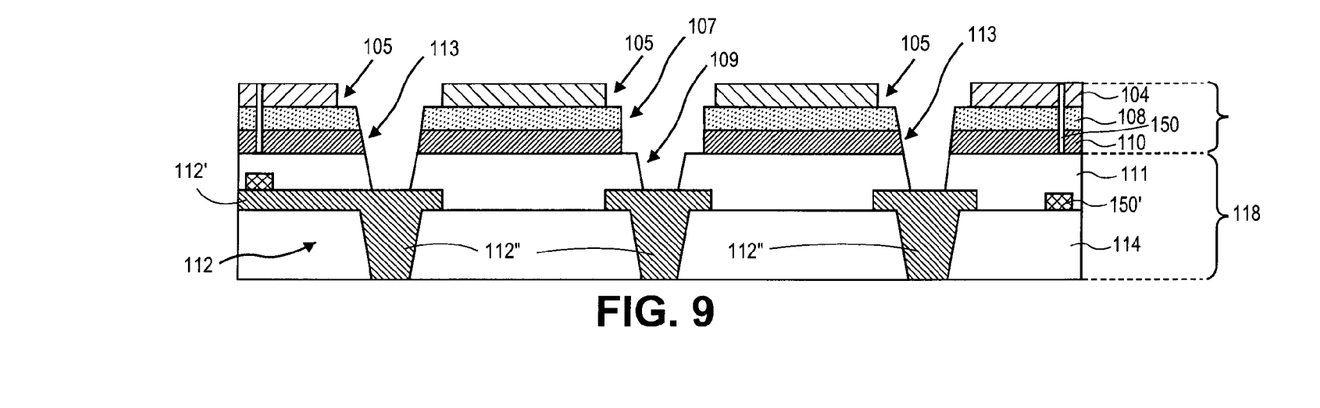
FIGS. 9-10 illustrate stages for patterning a non-patterned TFC embedded in a substrate according to a first embodiment.
Figure 10:
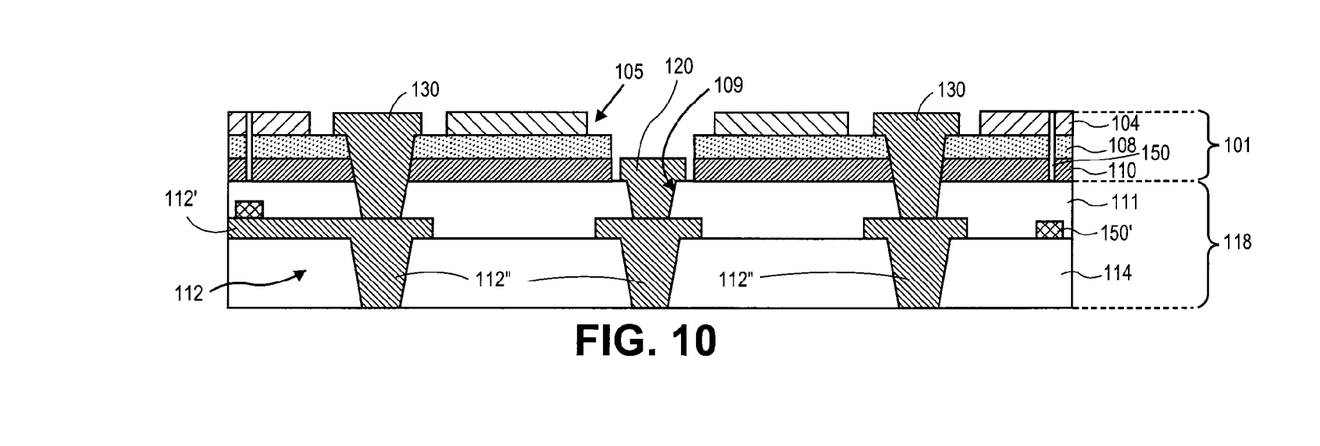

Reference will now be made to FIGS. 9 and 10, which show stages in the formation of the device 100 of FIG. 11, starting for example from the structure of FIG. 8 as noted above.

As seen in FIG. 9, providing a conductive via according to a first method embodiment comprises patterning the capacitor dielectric layer 108 and the bottom electrode layer 110 to form an opening 107 that exposes a portion of the polymer build-up layer 111. Patterning of the dielectric layer 108 may be accomplished using a conventional lithographic and etch patterning process, a lift-off process or even a physical removal technique such as, for example, laser ablation. Providing a conductive via according to a first method embodiment further comprises providing a via opening 109 that extends from the exposed portion of the polymer build-up layer 111 through that layer to underlying conductive structure 112 of the substrate 118. The via opening 109 may, for example, be provided in a well known manner using a chemical method, such as, for example, etching, or a physical method, such as, for example, laser drilling. Additional via openings 113 may be provided through the build-up layer 111/211 to the underlying conductive build-up layer 112 for the subsequent provision, in a well known manner, of vias 130 biased to the bottom electrode layer 110 as described above in relation to FIG. 11.

As seen in FIG. 10, providing a conductive via according to the first embodiment further includes filing the via opening 109 with conductive material to provide the conductive via 120. Conductive material may be deposited in via opening 109, and also in via openings 113, according to any one of well known techniques, such as, for example, electroplating, electroless plating, PVD or the like. After the deposition of the conductive material in the via openings, the deposited conductive material may be thinned and patterned to define the conductive vias 120 and 130. Thinning can be accomplished using, for instance, a wet chemical etch process, a dry etch processes, a chemical mechanical polishing processes, and/or the like. Patterning can be accomplished using a conventional lithographic and etch patterning process, a lift-off process, or the like. As in the case of the embodiment of FIG. 10, patterning may involve patterning the conductive material so as to isolate the conductive via 120 from the bottom electrode layer 110. Patterning may further involve patterning conductive material connected to conductive vias 130 in order to isolate those vias from the top electrode layer 104. The structure shown in FIG. 10 may be created using a semi-additive process, using, for example, lithographic alignment based on substrate-level fiducials 150'.

Referring next to FIG. 11, a method embodiment further includes providing a polymer build-up layer 122 onto the top electrode layer 104 such that material from the polymer build-up layer 122 is disposed to insulate the conductive via 120 from the bottom electrode layer 110. The build-up layer 122 may, for example, be laminated onto the top electrode layer 104 in a well known manner. Thereafter, the build-up layer 122 may be provided with vias 126, 128 and 130 in a well known manner, such as, for example, through a drilling of corresponding via openings and a filling of the same with conductive material, as explained above in relation to providing for example the conductive via 120.

Referring still to FIG. 11, providing the bridging interconnect 124 further includes providing a metallization layer onto the build-up layer 122, and patterning the metallization layer to yield the bridging interconnect. As noted above, provision of the metallization layer may be effected according to any one of well known methods, such as, for example, by way of electroless plating followed by electrolytic plating Patterning can be accomplished using a conventional lithographic and etch patterning process, a lift-off process, or the like. Patterning may involve patterning the metallization layer so as to isolate the conductive via 126 and 128 from rest of the vias. The structure shown in FIG. 11 may be created using a semi-additive process, using, for example, lithographic alignment based on substrate-level fiducials 150'.

As noted previously, the stages depicted in FIGS. 12-14 pertain to the fabrication of the embodiment of FIG. 15, starting for example from the structure of FIG. 8. Those stages will be described seriatim below.

Figure 12:
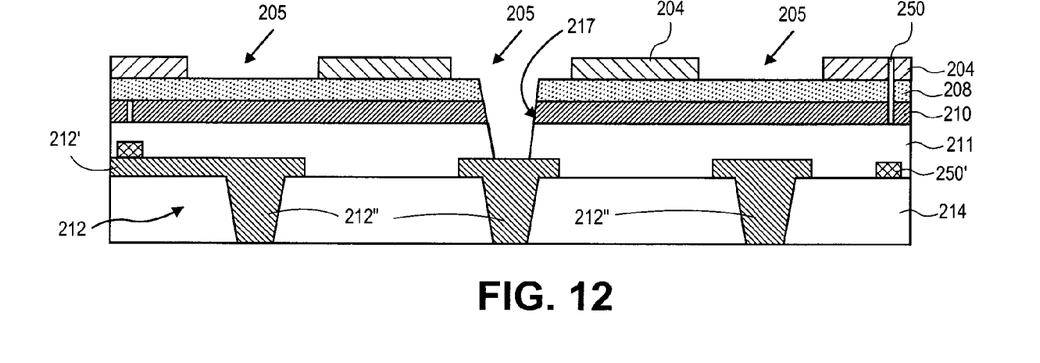
FIGS. 12-14 illustrate stages for patterning a non-patterned TFC embedded in a substrate according to a second embodiment.

Referring to FIG. 12, providing a conductive via according to a second method embodiment comprises providing an insulating via opening 217 that extends from one of the exposed portions of the capacitor dielectric layer 208 at one of openings 205 through layer 208 to underlying conductive structure 212 of the substrate 218. The insulating via opening 217 may, for example, be provided in a well known manner using laser drilling or etching.

Figure 13:
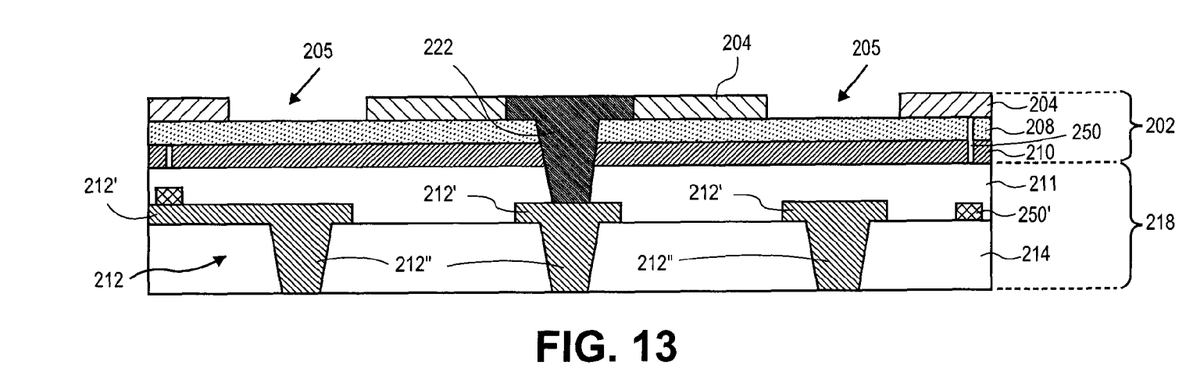

As seen in FIG. 13, providing a conductive via according to the first embodiment further includes filing the insulating via opening 217 with insulating material 222. The insulating material 222 may be deposited in insulating via opening 217 according to any one of well known techniques, such as, for example, by using a squeegee or an inkjet. According to one embodiment, the insulating material 222 may comprise, for example, an epoxy or a polymer/ceramic composite. An etch back for electrode metals, and grinding may optionally be performed after provision of the insulating material 222. Etch back of the metal might be needed in order to reduce the metal electrode in order to expose the insulating material for possible grinding. Grinding may be performed to ensure that the exposed top surface of the insulating material is flat and relatively smooth and flush against the metal electrode surface.

Figure 14:
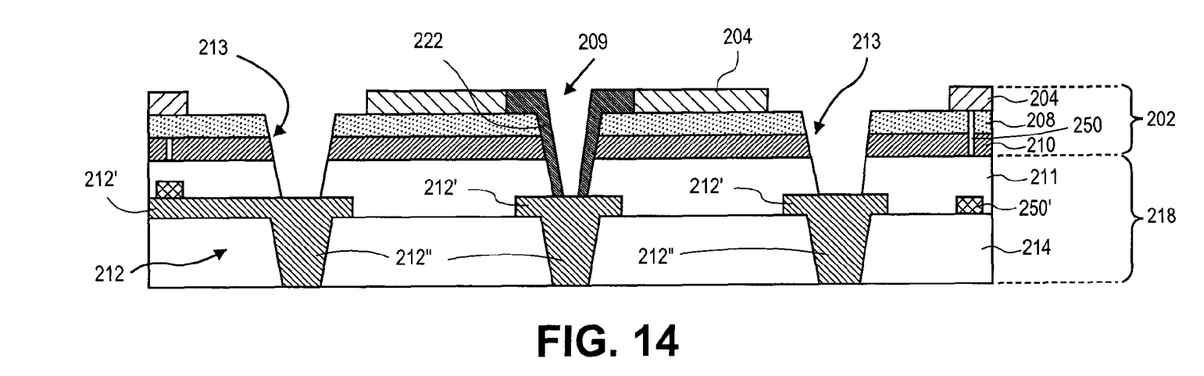

Referring next to FIG. 14, providing a conductive via comprises providing a conductive via opening 209 extending through the insulating material 222 to the underlying conductive structure 212 so as to leave an insulating sleeve 223 in the insulating via openings 209. The via opening 209 may, for example, be provided in a well known manner using laser drilling or etching. The provision of the via opening may further include a roughening process similar to a conventional desmear process in order to ensure adhesion of the conductive material of the via to the insulating material. Additional via openings 213 may be provided through the build-up layer 211 to the underlying conductive build-up layer 212 for the subsequent provision, in a well known manner, of vias 230 biased to the bottom electrode layer 210 as described above in relation to FIG. 15.

Referring now back to FIG. 15, providing a conductive via according to the second embodiment further includes filing the via opening 209 with conductive material to provide the conductive via 220. Conductive material may be deposited in via opening 209, and also in via openings 213, according to any one of well known techniques, such as, for example, electroplating, electroless plating, PVD or the like. After the deposition of the conductive material in the via openings, the deposited conductive material may be thinned and patterned to define the conductive vias 220 and 230. Thinning can be accomplished using, for instance, a wet chemical etch process, a dry etch processes, a chemical mechanical polishing processes, and/or the like. Patterning can be accomplished using a conventional lithographic and etch patterning process, a lift-off process, or the like. Patterning may involve patterning conductive material connected to conductive vias 230 in order to isolate those vias from the top electrode layer 204. The structure shown in FIG. 15 may be created using a semi-additive process, using, for example, lithographic alignment based on substrate-level fiducials 250'.

Referring still to FIG. 15, providing the bridging interconnect 224 includes providing a metallization layer onto the conductive via 220 and top electrode 204, and patterning the metallization layer to yield the bridging interconnect 224. As noted above, provision of the metallization layer may be effected according to any one of well known methods, such as, for example, by way of electroless plating followed by electrolytic plating. Patterning can be accomplished using a conventional lithographic and etch patterning process, a lift-off process, or the like. The structure shown in FIG. 15 may be created using a semi-additive process, using, for example, lithographic alignment based on substrate-level fiducials 250'.

Advantageously, embodiments address high risk processes in integrated pre-patterned thin film components into organic substrates by enabling tighter design rules, in this manner facilitating future scalability of TFC technology. By presenting a novel structure in the form of a bridging interconnect, embodiments allow embedding a completely unpatterned TFC into a build-up substrate, substantially mitigating design impacts associated with alignment tolerances of the prior art, and eliminating process flow requiring the patterning of thin film foil or the laminating of pre-patterned TFC's. Thus, embodiments allow the use of a low risk and scaleable embedding process with a tighter via pitch for high volume manufacturing and next generation products. Currently, the embedding of pre-patterned TFC's require a precise positioning of the TFC onto a substrate so the vias on the TFC's can be electrically connected to the existing underlying conductive structure of the substrate. Embodiments mitigate errors associated with the prior art embedding of TFC's, including errors due to the use of global alignment, lamination errors, errors from TFC patterning, etc. Such errors typically require design rules to be loose to accommodate a high yield requirement for the substrate. However, loose design rules limit the capability/scalability of TFC embedding technology against future design rules. Embodiments allow alignment based only on substrate fiducials, thus eliminating some sources of alignment error. In addition, advantageously, embodiments eliminate the need for TFC patterning prior to delivery by the supplier/prior to embedding by allowing a bridging back of a connection to a top electrode of the TFC through the TFC. Embodiments can use existing process flow stages allowing the use of current capability and equipment for enabling TFC technology.

Figure 16:
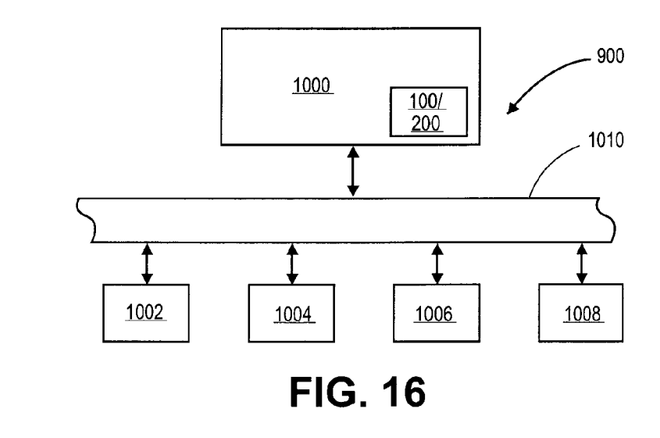
FIG. 16 is a schematic view of a system including a package similar to either of the packages shown in FIG. 11 or 15.

Referring to FIG. 16, there is illustrated one of many possible systems 900 in which embodiments of the present invention may be used. In one embodiment, the electronic assembly 1000 may include a microelectronic device such as device 100 of FIG. 11 or device 200 of FIG. 15. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 7, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 900 may be a wireless mobile phone, a personal digital assistant, a pocket PC, a tablet PC, a notebook PC, a desktop computer, a set-top box, a medio-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof

What is claimed is:

1. A microelectronic device comprising:
a substrate including a polymer build-up layer;
a passive structure embedded in the substrate and including:
a bottom conductive layer overlying the polymer build-up layer;
a dielectric layer overlying the bottom conductive layer;
a top conductive layer overlying the dielectric layer;
a conductive via extending through a portion of the passive structure;
an insulation material insulating the conductive via from the top conductive layer and the bottom conductive layer; and
a planar bridging interconnect having a planar portion disposed directly on and adjacent to the top conductive layer and directly on the conductive via, the bridging interconnect electrically connecting the conductive via to the top conductive layer.

2. The device of claim 1, wherein:
the top conductive layer is a top electrode layer;
the dielectric layer is a capacitor dielectric layer;
the bottom conductive layer is a bottom electrode layer;
a combination of the top electrode layer, the capacitor dielectric layer and the bottom electrode layer forms an embedded capacitor structure in the substrate.

3. The device of claim 2, further comprising an insulation sleeve surrounding side walls of the conductive via, the insulation material being a part of the insulation sleeve.

4. The device of claim 3, wherein the bridging interconnect overlies the conductive via and the top electrode layer.

5. The device of claim 2, wherein the conductive via is a top electrode conductive via, the device further comprising a bottom electrode conductive via extending through the capacitor dielectric layer, connected to the bottom electrode layer, and insulated from the top electrode layer.

6. The device of claim 2, wherein the capacitor dielectric layer includes a ceramic dielectric material.

7. The device of claim 3, wherein the ceramic dielectric material is selected from the group consisting of strontium titinate, barium strontium titanate, and/barium titinate.

8. The device of claim 7, wherein the substrate is an organic substrate.

9. The device of claim 8, wherein the substrate includes core comprising bismaleimide triazine resin.

10. A system comprising:
an electronic assembly including:
a microelectronic device comprising:
a substrate including a polymer build-up layer;
a passive structure embedded in the substrate and including:
a bottom conductive layer overlying the polymer build-up layer;
a dielectric layer overlying the bottom conductive layer;
a top conductive layer overlying the dielectric layer;
a conductive via extending through a portion of the passive structure;
an insulation material insulating the conductive via from the top conductive layer and the bottom conductive layer; and
a planar bridging interconnect having a planar portion disposed directly on and adjacent to the top conductive layer and directly on the conductive via, the bridging interconnect electrically connecting the conductive via to the top conductive layer; and
a main memory coupled to tile electronic assembly.

11. The system of claim 10, further comprising an insulation sleeve surrounding side walls of the conductive via, the insulation material being a part of the insulation sleeve.

12. A microelectronic device comprising:
a substrate including a polymer build-up layer;
a passive structure embedded in the substrate and including:
- a bottom conductive layer overlying the polymer build-up layer;
- a dielectric layer overlying the bottom conductive layer;
- a top conductive layer overlying the dielectric layer;

a first conductive via extending through a first portion of the passive structure;
a second conductive via extending through a second portion of the passive structure, the second conductive via being insulated from the top conductive layer and being electrically connected to the bottom conductive layer;
an insulation material insulating the first conductive via from the top conductive layer and the bottom conductive layer; and
a planar bridging interconnect having a planar portion disposed directly on and adjacent to the top conductive layer and directly on the first conductive via, a first portion of the bridging interconnect electrically connecting the first conductive via to the top conductive layer.

* * * * *